US012133336B2

(12) United States Patent
Sokol (10) Patent No.: US 12,133,336 B2
(45) Date of Patent: Oct. 29, 2024

(54) SYSTEMS AND METHODS FOR ADDITIVE MANUFACTURING PASSIVE RESISTOR-CAPACITOR FREQUENCY PASS FILTER (PRC FPF)

(71) Applicants: Nano Dimension Technologies, LTD., Nes Ziona (IL); THE IP LAW FIRM OF GUY LEVI, LLC, Wyckoff, NJ (US)

(72) Inventor: Daniel Sokol, Rishon L'etsion (IL)

(73) Assignee: Nano Dimension Technologies, LTD., Nes Ziona (IL)

( * ) Notice: Subject to any disclaimer, the term of this patent is extended or adjusted under 35 U.S.C. 154(b) by 38 days.

(21) Appl. No.: 18/012,776

(22) PCT Filed: Jun. 24, 2021

(86) PCT No.: PCT/US2021/038996
§ 371 (c)(1),
(2) Date: Dec. 23, 2022

(87) PCT Pub. No.: WO2021/263051
PCT Pub. Date: Dec. 30, 2021

(65) Prior Publication Data
US 2023/0269882 A1 Aug. 24, 2023

Related U.S. Application Data

(60) Provisional application No. 63/043,329, filed on Jun. 24, 2020.

(51) Int. Cl.
| | | |
|---|---|---|
| *H05K 3/12* | (2006.01) | |
| *B29C 64/112* | (2017.01) | |
| *B29C 64/386* | (2017.01) | |
| *B33Y 10/00* | (2015.01) | |
| *B33Y 50/00* | (2015.01) | |
| *H05K 1/16* | (2006.01) | |
| *B29L 31/34* | (2006.01) | |
| *B33Y 80/00* | (2015.01) | |

(52) U.S. Cl.
CPC ............ *H05K 3/125* (2013.01); *B29C 64/112* (2017.08); *B29C 64/386* (2017.08); *H05K 1/162* (2013.01); *H05K 1/167* (2013.01); *B29L 2031/3425* (2013.01); *B33Y 10/00* (2014.12); *B33Y 50/00* (2014.12); *B33Y 80/00* (2014.12); *H05K 2203/013* (2013.01)

(58) Field of Classification Search
CPC ......... B33Y 10/00; B33Y 50/00; B33Y 80/00; B29C 64/112; B29C 64/386; H05K 3/125; H05K 1/162; H05K 1/167; H05K 2203/013
See application file for complete search history.

(56) References Cited

U.S. PATENT DOCUMENTS

| | | |
|---|---|---|
| 2018/0031186 A1 | 2/2018 | Li et al. |
| 2018/0035282 A1 | 2/2018 | Kaliner |
| 2019/0098771 A1* | 3/2019 | Fima .................... H05K 3/4664 |
| 2019/0178599 A1 | 6/2019 | Pintar |
| 2019/0236534 A1 | 8/2019 | Kaneko et al. |
| 2020/0070245 A1 | 3/2020 | Fima et al. |

FOREIGN PATENT DOCUMENTS

| | | |
|---|---|---|
| WO | 2018031186 A1 | 2/2018 |
| WO | 2019236534 A1 | 12/2019 |

* cited by examiner

*Primary Examiner* — Michael P Wieczorek
(74) *Attorney, Agent, or Firm* — Guy Levi; The IP Law Firm of Guy Levi, LLC (57) ABSTRACT

The disclosure relates to systems and methods for fabricating passive RC frequency filter. More specifically, the disclosure is directed to computerized systems and methods for using additive manufacturing (AM) of simultaneous deposition of conductive and dielectric inks to form passive RC frequency pass filters having predetermined cutoff frequency with wide stop band frequency.

20 Claims, 7 Drawing Sheets

FIG. 1 (Current State of the Art)

SYSTEMS AND METHODS FOR ADDITIVE MANUFACTURING PASSIVE RESISTOR-CAPACITOR FREQUENCY PASS FILTER (PRC FPF)

CROSS REFERENCE TO RELATED APPLICATIONS

This patent application is a U.S. National Phase filing of commonly owned and pending PCT Application No. PCT/US21/38996, filed Jun. 24, 2021, which is based on and claims the benefit of the filing date of U.S. Provisional Patent Application Ser. No. 63/043,329, filed Jun. 24, 2020, both which are incorporated herein by reference in their entirely.

BACKGROUND

The disclosure is directed to systems and methods for fabricating passive RC frequency filter. More specifically, the disclosure is directed to computerized systems and methods for using additive manufacturing (AM) of simultaneous deposition of conductive and dielectric inks to form RC frequency pass filters having predetermined cutoff frequency with wide stop band frequency.

Low pass filters are utilized in radio frequency (RF) circuits to remove undesired harmonics or spurious signals resulting from the mixing of signals in, for example, the RF front end circuit.

Figure 7A:
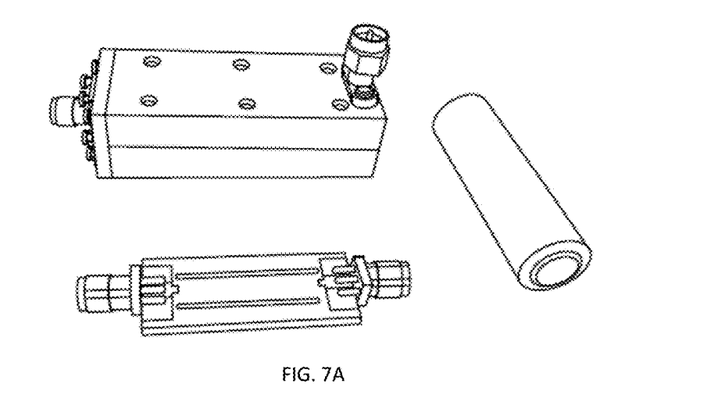
FIGS. 7A, and 7B, illustrates the difference in size between typical LPF fabricated using conventional methods (top), and a comparable AM-fabricated LPF (bottom).

While stepped impedance low pass filters and open stub low pass filters are commonly used for low pass filter implementation, the stepped impedance low pass filters and open stub low pass filters have a disadvantage in that both implementations typically provide a gradual cut-off response. By increasing the number of sections of the step impedance low pass filters or the open stub low pass filters, the rejection characteristics of the low pass filters can be improved somewhat. However, increasing the number of sections will increase passband insertion loss ($S_{21}$), as well as the physical dimensions of the low pass filters (see e.g., FIG. 7A, top).

Figure 1:
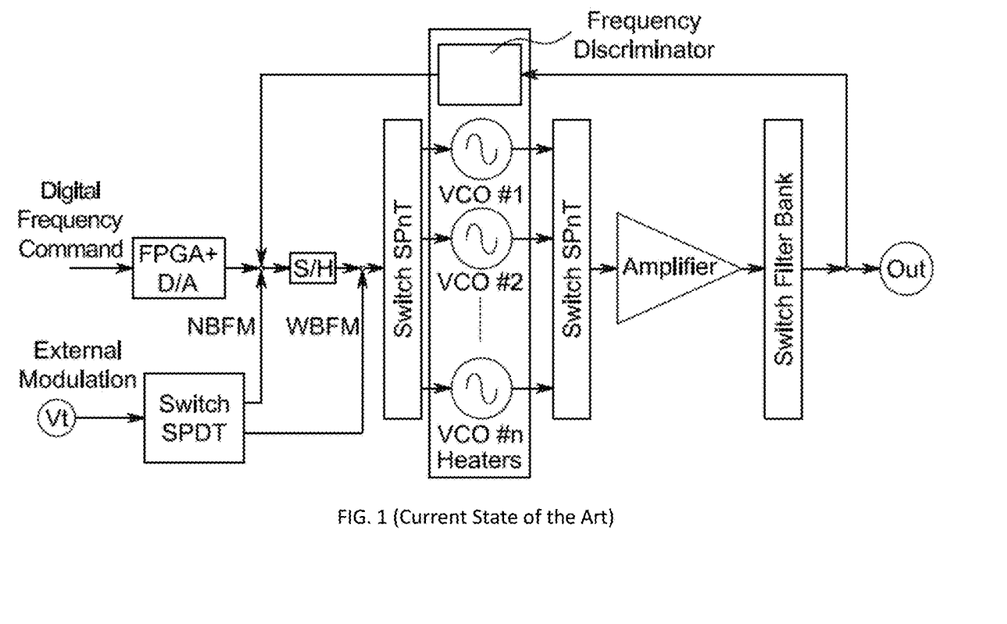
FIG. 1, is a prior art example of a circuit schematic for a shielded Phase-locked loop (PLL) where the switch filter bank can be replaced by the passive RC FPF formed using AM.

Some low pass filters employ a semi-lumped element composed of a lumped capacitor and a section of at least one transmission load trace to cope with this problem. However, the use of multiple lumped elements will increase the component cost of the low pass filters as well as increasing the assembly cost of RF integrated circuits, especially for low pass filters operating in a high RF frequency range. Multi-section low pass filters using microstrip line and microstrip elements such as interdigital capacitors, coupled lines and stepped-impedance hairpin resonators are other effective approaches. A stepped-impedance hairpin resonator allows design of low pass filters of relative smaller size and with an additional zero point in the stopband (e.g., achieved through an additional electric coupling path). (See e.g., FIG. 1)

In addition, defected ground structure (DGS) microstrip line structures have been utilized in low pass filters to implement wide stopband. However, the DGS microstrip line structure introduces disadvantages. For example, DGS microstrip line structure increase radiation due to a partially open ground plane, requiring a metallic enclosure to shield the DGS structure, and thereby increasing the cost of the low pass filters in conventional fabrication methodologies.

It is advantageous to design low pass filters with a wide stopband and a high stopband rejection to improve the linearity of the RF front end circuit and to reduce the bit-error-rate (BER) in high data rate communication systems. It is also advantageous for the low pass filter to have a compact size and an integration ability to reduce cost of the RF integrated circuit.

The present disclosure is directed toward overcoming one or more of the above-identified shortcomings by the use of additive manufacturing technologies and systems.

SUMMARY

Disclosed, in various exemplary implementations, are additive manufacturing methods for fabricating passive resistor-capacitor (RC) low/high/band pass filter. Specifically, provided in various exemplary implementations, are computerized systems, methods and programs for fabricating passive resistor-capacitor (RC) frequency (low/high/band) pass filters to be used in RF implementations, for at least one output port.

In an exemplary implementation provided herein is a method of fabricating a passive RC frequency pass filter comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module, in communication with each of the first, and second print heads, the CPM further comprising: at least one processor in communication with a non-transitory computer readable storage medium configured to store instructions that, when executed by the at least one processor cause the CPM to control the ink-jet printing system, by carrying out steps that comprise: receiving a 3D visualization file representing the frequency pass filter (FPF); and generating a file library having a plurality of files, each file representing a substantially 2D layer for printing the FPF and a metafile representing at least the printing order; providing the dielectric ink composition, and the conductive ink composition; using the CAM module, obtaining from the library a first file representative of the first layer for printing the FPF; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the a subsequent file representative of a subsequent layer for printing the FPF; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon printing the final layer, the passive RC FPF comprises: a plurality of resistors disposed in an intermediate layer configured in series with a transmission load trace; a plurality of capacitors disposed in an intermediate layer configured in parallel with the at least one transmission load trace, the plurality of capacitors are sized and operable to provide a predetermined cut-off frequency; and the transmission load line sized and configured to operably couple to each of the plurality of capacitors, and each of the plurality of resistors; and removing the substrate.

In an exemplary implementation, the passive RC FPF fabricated using the additive manufacturing (AM) methods and systems disclosed, is a first low pass filter (LPF1) having a cut-off frequency of 2.4 GHz, with a frequency rolloff rate of no less than about −25 dB/GHz, insertion loss ($\approx S_{21}$) of less than about 2.0 dB, and a stop band of less than −25 dB between 3.4 GHz and at least 20 GHz, for unshielded at least one transmission load trace(s).

In another exemplary implementation, the RC FPF fabricated using the additive manufacturing methods and systems disclosed, is a second low pass filter (LPF2) having a cut-off frequency of 2.4 GHz, with a frequency rolloff rate of no less than about −22.5 dB/GHz, insertion loss ($\approx S_{21}$) of less than about 2.0 dB, and a stop band of less than −25 dB between 3.4 GHz and at least 11 GHz, for shielded transmission load trace(s).

In another exemplary implementation, the RC FPF fabricated using the additive manufacturing methods and systems disclosed, is a third low pass filter (LPF3) having a cut-off frequency of 5.0 GHz, with a frequency rolloff rate of no less than about −27 dB/GHz, insertion loss ($\approx$S21) of less than about 2.0 dB, and a stop band of less than −25 dB between 6.1 GHz and at least 20 GHz, for unshielded transmission load trace(s).

In another exemplary implementation, the passive RC FPF fabricated using the additive manufacturing methods and systems disclosed, is a fourth low pass filter (LPF4) having a cut-off frequency of 5.0 GHz, with a frequency rolloff rate of no less than about −27 dB/GHz, insertion loss ($\approx S_{21}$) of less than about 3.0 dB, and a stop band of less than −15 dB between 6.1 GHz and at least 15 GHz, for shielded transmission load trace(s).

BRIEF DESCRIPTION OF THE FIGURES

For a better understanding of the direct or indirect additive manufacturing methods and systems for fabricating passive resistor-capacitor (RC) frequency (low/high/band) pass filters, with regard to the exemplary implementations thereof, reference is made to the accompanying examples and figures, in which:

FIG. 2A is a top right cut-away perspective view of an example of a low-pass filter (LPF), with a top right cut-away perspective view thereof in FIG. 2B and FIG. 2C illustrating RC FPF fabricated using the methods of AM implemented in the systems described;

DETAILED DESCRIPTION

Provided herein are examples of computerized systems and methods for using additive manufacturing of simultaneous deposition of conductive and dielectric inks to form RC frequency pass filters having predetermined cutoff frequency with wide stop band frequency.

RF filter design is a full process taking into account requirement for final system. The system (e.g., PLL, DDS-PLL, ADPLL) typically have input signal and the ability to "ignore" the irrelevant spectrum. There is a need for a filter on input with 3 options 1) lowpass 2) bandpass, and 3) high pass. All three types of filters could be implemented with resistors, capacitors, coils, semi-conductor devices. The implementation with those components could be done by coaxial technology and SMT as well, which raise the issue of connecting components together, creating reflection in frequency. Using the methods disclosed, implemented in the systems provided, the capacitors, coils, at least one transmission load trace(s) (shielded or not) and the ground plane layer are printed as integral part of the circuit, internally in board. This way parasitic behavior of misalignment between connections is substantially avoided. Similarly, using the methods disclosed, implemented in the systems provided, filter of described type covered with metallic box that behave like Faraday cage can be fabricated to isolate the filter from the environment.

Specifically, in certain exemplary implementations, provided are computerized system for producing Additively Manufactured Electronic (AME) devices and systems. The systems disclosed use ink jet infrastructure for simultaneously depositing a conductive ink (CI) based on, for example, silver nano-particles (although additional print heads with CI having different materials, such as copper are also contemplated), and dielectric ink (DI) based on photopolymerizable resins. Using this method, the system simultaneously is configured to build 3D composite devices designed using established design rules at predetermined order.

Starting from a 3D image file of the designed device, and selectively changing the pattern of CI and DI in each layer for printing, while each substantially 2D layer is comprised of either both patterns, or a single DI/CI pattern with the metafile further including instructions relating (in other words addressing the relationship between the patterns) to the corresponding CI/DI not included in that particular substantial 2D layer for printing; and separately (in other words, using in an example, two different means, such as UV source, and a heating source such as, for example, an IR lamp), sintering and curing that pattern allows to create applications' devices that range from the very difficult, to those practically impossible for fabrication using standard (subtractive) fabrication methods of Printed Circuit Boards (PCBs). The methods, systems and programs disclosed were used to develop multi-layer capacitors of different area geometry and different layers' count, allowing wide range of capacitance, from several picofarad (pF) to several nanofarad (nF), or over three (3) orders of magnitude. The described Frequency (e.g., high, low) Pass Filters (FPF) units are realized by using at least one transmission load trace(s) with capacitors coupled to a ground layer (see e.g., FIGS. 2A, 2B).

Different transmission load trace(s) lengths, widths, capacitors' capacitance value and count designed and fabricated using the disclosed methods and implemented in the systems disclosed, affect different notches in transmission function thus enabling control and improve various S-parameters, such as insertion loss ($S_{21}$), and return loss ($S_{11}$).

Accordingly and in an exemplary configuration, provided herein is a method of fabricating a passive RC frequency pass filter (FPF) comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module, in communication with each of the first, and second print heads, the CPM further comprising: at least one processor in communication with a non-transitory computer readable storage medium configured to store instructions that, when executed by the at least one processor cause the CPM to control the ink-jet printing system, by carrying out steps that comprise: receiving a 3D visualization file representing the frequency pass filter (FPF); and generating a file library having a plurality of files, each file representing a substantially 2D layer for printing the FPF and a metafile representing at least the printing order. If the layer file specifies a single ink, for example only CI, the metafile will further represent the ratio between the CI layers to be printed before the next layer having both patterns or only DI pattern is printed. Thereafter, providing the dielectric ink composition, and the conductive ink composition; using the CAM module, using the metafiles, obtaining from the library the file representative of the first layer for printing the FPF; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the a subsequent file representative of a subsequent layer for printing the FPF; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon printing the final layer, the passive RC FPF comprises: a plurality of resistors disposed in an intermediate layer configured in series with at least one transmission load trace; a plurality of capacitors disposed in an intermediate layer configured in parallel with the at least one transmission load trace, the plurality of capacitors are sized and operable to provide a predetermined cut-off frequency; and the at least one transmission load trace (interchangeable with transmission load line) sized and configured to operably couple to each of the plurality of capacitors, and each of the plurality of resistors; and removing the substrate.

Figure 4A:
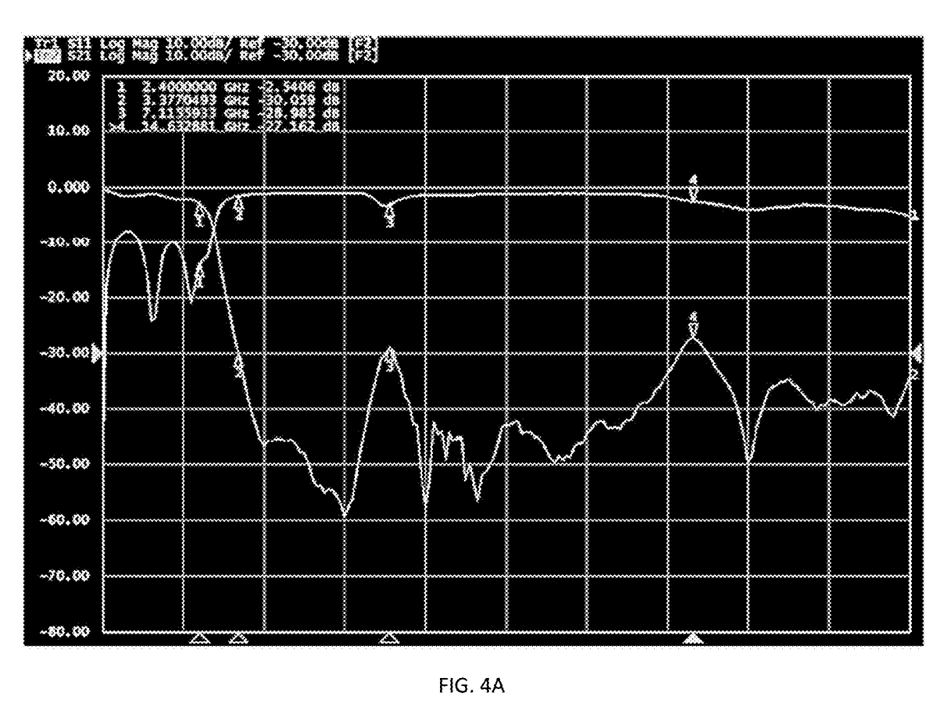
FIG. 4A, illustrates a frequency sweep of the unshielded passive RC LPF of FIG. 3A and shielded frequency sweep in FIG. 4B.
Figure 4B:
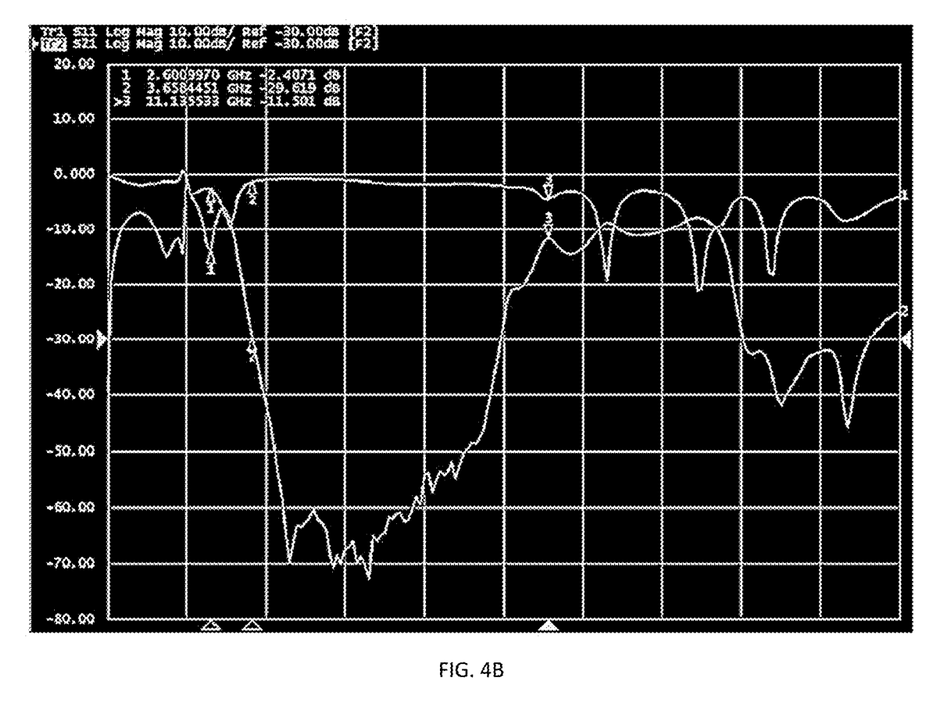

In the context of the disclosure "Frequency Pass Filter" means generally, high pass filter, and/or bandpass filter, and/or low pass filter, whereby the term high pass filter means filter impedance characteristic has a peak at a first frequency and a notch at a second frequency (where the second frequency is higher than the first frequency), and the term low pass filter means filter impedance characteristic has a notch at a first frequency and a peak at a second frequency (where the second frequency is higher than the first frequency) (see e.g., FIG. 4A, 4B). In certain implementations, the FPF is a low-pass filter (LPF) and wherein the at least one transmission load trace (at least one transmission load line) and the capacitors are operable to deliver a frequency cut off at 2.4 GHz, or in other implementations, the FPF is a low-pass filter and wherein the at least one transmission load trace and the capacitors are operable to deliver a frequency cut off at 5.0 GHz.

In the context of the disclosure, the term "rolloff" refers to the steepness, or slope, of the filter response in the transition region from the passband to the stopband. For example, a particular digital filter may be said to have a rolloff of 12 dB/octave—meaning that the first octave of a frequency $f_0$, or $2f_0$, would be attenuated by 12 dB more than the filter attenuation at $f_0$. The second octave, $4f_0$, would be attenuated by 24 dB more than the filter attenuation at $f_0$, and so on. Likewise, the term "stopband" refers to a band of frequencies attenuated by the RC FPF by a predetermined amount, such that the output signal at the corresponding frequencies within the stopband do not detract from or otherwise impact downstream processing. By way of example, the stopband may include all frequencies, for which the output signal is attenuated by a −20 dB or more. Stopband attenuation is measured between a peak passband amplitude and the largest stopband lobe amplitude. Furthermore, the term "cutoff frequency" refers to an upper passband frequency for low-pass filters, and a lower passband frequency for high-pass filters. For example, a cutoff frequency may be determined by a point at which the frequency response (or the frequency domain description of how the FPF interacts with input signals) exhibits a select amount of attenuation, such as the −3 dB point of a filter magnitude response relative to a peak passband value.

The at least one transmission load trace(s), or transmission load lines disclosed (in other words, trace lines that transmit electromagnetic (EM) signals from point to point), can be effectively a coaxial (e.g., a shielded microstrip) at least one transmission load trace, integral with the FPF device(s) or unshielded traces of varying widths and lengths (see e.g., 302-306, FIG. 3A), forming an integral feeder infrastructure that does not require external wiring or coupling to external components. Moreover, at least one transmission load trace 101*i* can, in certain examples, be substantially circular in cross-section. In the context of the disclosure, the term 'coaxial' means the various layers/regions of at least one transmission load trace 101*i* have a common propagation axis. In another example the layers/regions of at least one transmission load trace 101*i* are fabricated such that once the printing of the 2D layers is completed, the layers/regions have the same geometric center. In certain examples, the at least one transmission load trace(s) fabricated using the systems, methods and programs disclosed herein are coaxial and concentric, whereas in other examples; the at least one transmission load trace(s) are not coaxial nor concentric. In addition, because of the fabrication method(s) disclosed herein, the at least one transmission load trace(s) of certain examples are not limited to those circular in cross-section, rather, at least one transmission load trace(s) with other cross-sections are contemplated, including but not limited to, rectangular and elliptical cross-sections. As used herein, the term "integral" is defined as molded, or otherwise formed, as a single unitary part of the passive RC FPF disclosed.

The systems, methods and compositions described herein can be used to form/fabricate a FPF, utilizing a combination of print heads with conductive and dielectric ink compositions in a single, continuously additive manufacturing process (pass), using for example, an inkjet printing device, or using several passes. Using the systems, methods and compositions described herein, a thermoset resin material can be used to form the insulating and/or dielectric portion of the printed boards (see e.g., 100 FIG. 2A). This printed dielectric inkjet ink (DI) material is printed in optimized shape including accurate via locations (see e.g., FIG. 2B, 103*p*), plated through holes for passive RC FPF 350 (see e.g., 5.0 GHz passive RC LPF FIG. 3B).

The passive RC FPFs described herein, may be fabricated from any suitable additive manufacturing material, such as metal powder(s) (e.g., cobalt chrome, steels, aluminum, titanium and/or nickel alloys), gas atomized metal powder(s), thermoplastic powder(s) (e.g., polylactic acid (PLA), acrylonitrile butadiene styrene (ABS), and/or high-density polyethylene (HDPE)), photopolymer resin(s) (e.g., UV-curable photopolymers such as, for example PMMA), thermoset resin(s), thermoplastic resin(s), or any other suitable material that enables the functionality as described herein.

The systems used can typically comprise several sub-systems and modules. These can be, for example: additional conductive and dielectric print-heads, a mechanical sub-system to control the movement of the print heads, the chuck, its heating and conveyor motions; the ink composition injection systems; the curing/sintering sub-systems; a computerized sub-system with at least one processor or CPU (or GPU) that is configured to control the process and generates the appropriate printing instructions, a component placement system (e.g., for an external resonant capacitor across the secondary winding element's terminals), such as automated robotic arm, a hot air knife for soldering, a machine vision system, and a command and control system to control the 3D printing.

Accordingly the method of using AM for fabricating passive RC FPFs comprises: providing a printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module in communication with the first print head, the second print heads, and the conveyor, the CAM module comprising: at least one processor; a non-volatile memory storing thereon a set of executable instructions, configured, when executed to cause the at least one processor to: receive a 3D visualization file (e.g., a Gerber file), representing the 3D design of the passive RC FPFs; using the 3D visualization file, generate a file library comprising a plurality of layer files, each layer file representing a substantially 2D layer for printing the AM passive RC FPFs, upon completion of the printing.

In the context of the disclosure, the term "2D file library" refers to a given set of files that when assembled and printed together define a single passive RC FPF, or a plurality of passive RC FPFs used for a given purpose. Furthermore, the term "2D file library" can also be used to refer to a set of 2D files or any other raster graphic file format (the representation of images as a collection of pixels, generally in the form of a rectangular grid, e.g., BMP, PNG, TIFF, GIF), capable of being indexed, searched, and reassembled, to provide the structural layers of the RC FPF, whether the search is for the passive RC FPF as a whole, or a given specific 2D layer within the RC FPF.

Moreover, each file in the 2D file library, has an associated metadata defining the print order of the layer and other instructions for the printing system, such as printing speed (m/sec), order of the CI vs. DI and the like. As indicated, the metadata file will also contain the interrelationship between the CI and DI in those files where only one ink type is used. In the context of the disclosure, "metadata" is used herein to generally refer to data that describes other data, such as data that describes the CI and/or DI pattern to be printed. It will be understood, however, that the term "data" as used herein can refer to either data or metadata. Accordingly, the library, parsed automatically from the 3D image file, is comprised of three different file types corresponding to a substantially 2D layers for printing. Thus the library has at least one of: at least one file comprising only a DI pattern, at least one file comprising only CI pattern, and at least one file comprising both DI pattern AND CI pattern for printing. Each file type metadata will further comprise the interrelationship between the specific file type (CI, DI, Both) and other files in the library.

Using the library, the system is operable to retrieve a 2D file for printing and generate for example (depending e.g., on the 2D layer file's metadata), a conductive ink pattern comprising the conductive portion of each of the 2D layer files for printing the conductive portion of the retrieved layer of the Passive RC FPF then generate the ink pattern corresponding to the dielectric ink portion of each of the 2D layer files for printing a dielectric portion of the Passive RC FPF layer, wherein the CAM module is configured and operable to control each of the first and the second print heads, thereby obtaining the 2D layer. Then depending on the printing order configured in the 2D file's metadata, using the first print head, forming the pattern corresponding to the dielectric ink in the retrieved 2D layer file, and curing the DI pattern. Then using the second print head, forming the pattern corresponding to the conductive ink in the retrieved 2D layer file, and sintering the pattern corresponding to the conductive ink, thereby obtaining a single, substantially 2D layer of the passive RC FPF. In the context of the disclosure, substantially 2D layer means a single layer forming a film of a thickness of between about 10 µm and about 55 µm, for example, between about 15 µm and about 45 µm, or between about 17 µm and about 35 µm.

In relation to systems, devices and programs (methods), the term "operable" means the system and/or the device and/or the program is fully functional and calibrated, comprises elements for, and meets applicable operability requirements to perform a recited function and/or step when activated or when an executable program is executed by at least one processor associated with the system and/or the device. In relation to systems and circuits, the term "operable" means the system and/or the circuit is fully functional and calibrated, comprises logic for, and meets applicable operability requirements to perform a recited function and/or step when executed by at least one processor.

Unless specifically stated otherwise as apparent from the following discussions, it should appreciated that throughout the disclosure, discussions utilizing terms such as "accessing" or "retrieving" or "forming" or "processing" or "performing" or "generating" or "displaying" or "obtaining" or "creating" or "executing" or "continuing" or "calculating" or "determining" or the like, refer to the action and processes of, or under the control of, a computer system, or similar electronic computing device, that manipulates and transforms data and/or metadata represented as physical (electronic) quantities within the computer system's registers, libraries, databases and memory storage devices, into other data similarly represented as physical quantities within the computer system memories or registers or other such information storage, transmission or display devices. It should be noted however, that all of these and similar terms are to be associated with the appropriate physical quantities and are merely convenient labels applied to these actions and quantities.

Furthermore, the set of executable instructions are further configured, when executed to cause the at least one processor to: retrieve from the library subsequent layers' files, each subsequent layers' file represents the substantially two dimensional (2D) subsequent layer for printing a subsequent portion of the passive RC FPF or passive resistor/capacitor circuit(s). Retrieving the subsequent layers' files, each containing the CI and/or DI (or optionally support ink pattern) pattern for printing, as well as, in certain configurations, printing instruction data as coded in the metadata, is performed for example, using the CAM module. It is noted, that once converted, the 2D file library can be connected remotely to the system, and does not need to reside physically on the same non-transitory memory storage device storing the executable instructions used to perform the various method steps disclosed.

The CAM module can therefore comprise, or be in communication with: the 2D file library storing the plurality of files converted from the 3D visualization files of the passive RC FPFs. So, to reiterate, the term "library, as used herein, refers to the collection of 2D layer files derived from the 3D visualization file, containing the information necessary to print each conductive and dielectric pattern, which is accessible and used by the data collection application, and which can be executed by the computer-readable media. The CAM module further comprises at least one processor in communication with the library; a non-transitory memory storage device storing a set of operational instructions for execution by the processor; a micromechanical inkjet print head or heads in communication with the processor and with the library; and a print head (or, heads') interface circuit in communication with the 2D file library, the memory and the micromechanical inkjet print head or heads, the 2D file library configured to provide printer operation parameters specific to a functional layer, for example, using a metadata per 2D layer file.

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices. Furthermore, in certain exemplary implementations, the term "module" refers to a monolithic or distributed hardware unit(s). Also, the term "dispense", in the context of the first print-head is used to designate the device from which the ink drops are dispensed. The dispenser can be, for example an apparatus for dispensing small quantities of liquid including microvalves, piezoelectric dispensers, continuous-jet print-heads, boiling (bubble-jet) dispensers, and others—affecting the temperature and properties of the fluid flowing through the dispenser.

In certain implementations of the methods and programs disclosed, implemented in the systems disclosed, provided is a low pass filter having a cut-off frequency of 2.4 GHz, with a frequency rolloff rate (in other words, the change of power as a function of change in frequency in the stop band), of no less than about −25 dB/GHz (≈−46 dB/octave), insertion loss (≈$S_{21}$) of less than about 2.0 dB, and a stop band, or isolation parameter ($S_{12}$) of less than −25 dB between 3.4 GHz and at least 20 GHz (see e.g., FIG. 4A), for unshielded at least one transmission load trace(s), or, in another exemplary implementation, a low pass filter having a cut-off frequency of 2.4 GHz, with a frequency rolloff rate of no less than about −22.5 dB/GHz (≈−60 dB/octave), with insertion loss (≈$S_{21}$) of less than about 2.0 dB, and a stop band or isolation parameter ($S_{12}$) of less than −25 dB between 3.6 GHz and at least 11 GHz, for shielded at least one transmission load trace(s).

Furthermore, in certain implementations of the methods and programs disclosed, implemented in the systems disclosed, provided herein is a low pass filter having a cut-off frequency of 5.0 GHz, with a frequency rolloff rate of no less than about −27 dB/GHz (≈ at least −50 dB/octave), with insertion loss ($S_{21}$) of less than about 2.0 dB, and a stop band or isolation parameter ($S_{12}$) of less than −25 dB between 6.2 GHz and at least 20 GHz, for unshielded at least one transmission load trace(s), or a low pass filter having a cut-off frequency of 5.0 GHz, with a frequency rolloff rate of no less than about −27 dB/GHz (≈ at least −50 dB/octave), insertion loss (≈$S_{21}$) of less than about 3.0 dB, and a stop band or isolation parameter ($S_{12}$) of less than −15 dB between 6.1 GHz and at least 15 GHz, for shielded at least one transmission load trace(s).

Figures 2A, 2B:
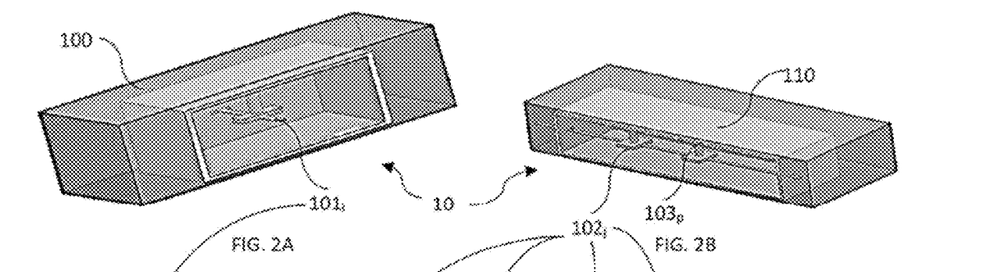

In certain examples, and as illustrated in FIGS. 2A, 2B at least one ground plane layer 110 that can ground capacitors 102*j*, is a ground layer on top of the structure illustrated in FIG. 2B, which maintains contact with buried, and/or blind vias 103*p*. Printed ground layer(s) 110 is indicated as present in an intermediate layer of the laminate structure illustrated. Furthermore, at least one ground plane layer 110, upon printing the final layer, can each be printed as a mesh (in other words, defected ground structure (DGS) to implement wide stopband) each mesh layer covering between about 40% and about 99% of the area of the intermediate layer area. The mesh can be adapted to the components used in the FPF in terms of mesh density (in other words, CI per unit area, unit-less ($mm^2/mm^2$ e.g.) by forming a resonant gap or slot in the ground layer, placed directly under, for example, a corresponding transmission load trace and aligned for efficient coupling to that line. Furthermore, in certain exemplary implementations, the RC FPF is configured to have a plurality of DGS layers, thereby further reducing the insertion loss ($S_{21}$) of the passive RC FPF.

In certain implementations upon printing the final layer, using the methods and programs disclosed, implemented in the systems disclosed, each capacitor printed is comprised of two conductive layer of the same or different geometry, each capacitor layer sized and adapted to have a thickness of between about 10 μm and about 60 μm, for example, between about 15 μm and about 55 μm, or between about 17 μm and about 35 μm. Similarly, the two conductive layers forming each capacitor, (see e.g., 102*j*, FIG. 2B), are separated by dielectric ink layer having a thickness of between about 15 μm and about 60 μm, for example, between about 20 μm and about 55 μm, or between about 35 μm and about 50 μm.

Likewise, in certain exemplary implementations, the transmission (load) line coupling adjacent capacitors, formed using the methods and programs disclosed, implemented in the systems disclosed, has a width (W) of between about 600 μm and about 2000 μm, and a length (L) of between about 2000 μm and about 10,000 μm, at least one transmission load trace(s)ize and configured to have an aspect ratio L/W>2.

The term "forming" (and its variants "formed", etc.) refers in an exemplary implementation to pumping, injecting, pouring, releasing, displacing, spotting, circulating, or otherwise placing a fluid or material (e.g., the conducting ink) in contact with another material (e.g., the substrate, the resin or another layer) using any suitable manner known in the art.

Curing the insulating and/or dielectric layer or pattern deposited by the appropriate print head as described herein, can be achieved by, for example, heating, photopolymerizing, drying, depositing plasma, annealing, facilitating redox reaction, irradiation by ultraviolet beam or a combination comprising one or more of the foregoing. Curing does not need to be carried out with a single process and can involve several processes either simultaneously or sequentially, (e.g., drying and heating and depositing crosslinking agent with an additional print head included with the system, but not in any way structurally necessary)

Furthermore, and in another implementation, crosslinking refers to joining moieties together by covalent bonding using a crosslinking agent, i.e., forming a linking group, or by the radical polymerization of monomers such as, but not limited to methacrylates, methacrylamides, acrylates, or acrylamides. In some exemplary implementation, the linking groups are grown to the end of the polymer arms.

Therefore, in an exemplary implementation, the vinyl constituents used as part of the DI, are monomers, comonomers, and/or oligomers selected from the group comprising a multifunctional acrylate, their carbonate copolymers, their urethane copolymers, or a composition of monomers and/or oligomers comprising the foregoing. Thus, the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing In an exemplary implementation, the term "copolymer" means a polymer derived from two or more monomers (including terpolymers, tetrapolymers, etc.), and the term "polymer" refers to any carbon-containing compound having repeat units from one or more different monomers.

Other functional heads may be located before, between or after the inkjet ink print heads used in the systems for implementing the methods described herein. These may include a source of electromagnetic radiation configured to emit electromagnetic radiation at a predetermined wavelength ($\lambda$), for example, between 190 nm and about 400 nm, e.g. 395 nm which in an exemplary implementation, can be used to accelerate and/or modulate and/or facilitate a photopolymerizable insulating and/or dielectric that can be used in conjunction with metal nanoparticles dispersion used in the conductive ink. Other functional heads can be heating elements, additional printing heads with various inks (e.g., support, pre-soldering connective ink, label printing of various components for example capacitors, transistors and the like) and a combination of the foregoing.

Other similar functional steps (and therefore the support systems for affecting these steps) may be taken before or after each of the DI or CI inkjet ink print heads (e.g., for sintering the conducting layer). These steps may include (but not limited to): photobleaching (of a photoresist mask support pattern), photocuring, or exposure to any other appropriate actinic radiation source (using e.g., a UV light source); drying (e.g., using vacuum region, or heating element); (reactive) plasma deposition (e.g., using pressurized plasma gun and a plasma beam controller); cross linking such as by using cationic initiator e.g. [4-[(2-hydroxytetradecyl)-oxyl]-phenyl]-phenyliodonium hexafluoro antimonate to a flexible resin polymer solutions or flexible conductive resin solutions; prior to coating; annealing, or facilitating redox reactions and their combination regardless of the order in which these processes are utilized. In certain exemplary implementation, a laser (for example, selective laser sintering/melting, direct laser sintering/melting), or electron-beam melting can be used on the rigid resin, and/or the flexible portion.

Formulating the conducting ink composition may take into account the requirements, if any, imposed by the deposition tool (e.g., in terms of viscosity and surface tension of the composition) and the deposition surface characteristics (e.g., hydrophilic or hydrophobic, and the interfacial energy of the substrate or the support material (e.g., glass, PC, PEI and the like) if used), or the substrate layer on which consecutive layers are deposited. For example, the viscosity of either the conducting inkjet ink and/or the DI (measured at the printing temperature ° C.) can be, for example, not lower than about 5 cP, e.g., not lower than about 8 cP, or not lower than about 10 cP, and not higher than about 30 cP, e.g., not higher than about 20 cP, or not higher than about 15 cP. The conducting ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

In an exemplary implementation, the term "chuck" is intended to mean a mechanism for supporting, holding, or retaining a substrate or a workpiece. The chuck may include one or more pieces. In one exemplary implementation, the chuck may include a combination of a stage and an insert, a platform, be jacketed or otherwise be configured for heating and/or cooling and have another similar component, or any combination thereof.

In an exemplary implementation, the ink-jet ink compositions, systems and methods allowing for a direct, continuous or semi-continuous ink-jet printing are implemented to form/fabricate passive RC FPF and/or shielded Phase-locked loop (PLL) comprising the passive RC FPF formed using the methods and programs disclosed, implemented in the systems disclosed. The PLL is comprised of circuit operable to lock the phase of the generated output signal in a predetermined phase relation with an incoming reference signal. Thus, in the context of the disclosure, the term "phase-locked loop" (PLL) includes any type of phase-locking or synchronizing circuitry such as circuits commonly referred to as PLLs as well as delay-locked loops, so-called DLLs, when these loops are utilized for phase locking or synchronizing purposes. In certain implementations, the PLL will further comprise voltage controlled oscillator (VCO), and in another exemplary implementation, form a direct digital synthesis PLL (DDS-PLL) system, where the passive RC FPF is operable to remove spurious frequency components above a predetermined frequency as demonstrated herein.

Likewise, other AM electronic circuits (AME) can be fabricated, patterned by expelling droplets of the liquid ink-jet ink provided herein from an orifice one-at-a-time, as the print-head (or the chuck) is maneuvered, for example in two (X-Y) (it should be understood that the print head also move in the Z axis to, for example, to form the blind and/or buried vias coupling the capacitor layers to the ground plane layer) dimensioned at a predetermined distance above chuck or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an exemplary implementation, from within a well operably coupled to the orifice. The printing of the first inkjet metallic ink can be additive and can accommodate a greater number of layers. The ink-jet print heads provided used in the methods described herein can provide a minimum layer film thickness equal to or less than about 0.3 µm-10,000 µm.

The conveyor maneuvering among the various print heads used in the methods described and implementable in the systems described can be configured to move at a velocity of between about 5 mm/sec and about 1000 mm/sec. The velocity of the chuck e.g., can depend, for example, on: the desired throughput, the number of print heads used in the process, the number and thickness of layers of the printed circuit boards including built-in passive and embedded active components described herein printed, the curing time of the ink, the evaporation rate of the ink solvents, the distance between the print head(s) containing the first ink-jet conducting ink of the metal particles or metallic polymer paste and the second print head comprising the second, thermoset resin and board forming inkjet ink, and the like or a combination of factors comprising one or more of the foregoing.

In an exemplary implementation, the volume of each droplet of the metallic (or metallic) ink, and/or the second, resin ink, can range from 0.5 to 300 picoLiter (pL), for example 1-4 pL and depended on the strength of the driving pulse, its waveform and the properties of the ink. The waveform to expel a single droplet can be a 10V to about 70 V pulse, or about 16V to about 20V, and can the ink be expelled at frequencies between about 2 kHz and about 500 kHz. It is noted that using the fabrication systems provided herein, control using the waveform enables control over each nozzle in the print-heads' nozzle array to achieve drop-on-demand (DOD), which is beneficial for the necessary accuracy required for the helical winding(s)

The 3D visualization file representing the printed circuit boards including built-in passive and embedded active components used for the fabrication of the cPCBT and or the cPCB-based circuits containing a single inductor coil (cPCBI), can be: an ODB, an ODB++, an.asm, an STL, an IGES, a DXF, a DMIS, NC, a STEP, a Catia, a SolidWorks, a Autocad, a ProE, a 3D Studio, a Gerber, an EXCELLON file, a Rhino, a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

The computer controlling the printing process described herein can comprise: a computer readable storage medium having computer readable program code embodied therewith, the computer readable program code when executed by a processor in a digital computing device causes a three-dimensional inkjet printing unit to perform the steps of: pre-process Computer-Aided Design/Computer-Aided Manufacturing (CAD/CAM) generated information (e.g., the 3D visualization file), associated with the passive RC FPF described, thereby creating a library of a plurality of 2D files (in other words, the file that represents at least one, substantially 2D layer for printing the passive RC FPF), which then can direct a stream of droplets of a metallic material from a second inkjet print head of the three-dimensional inkjet printing unit at a surface of a substrate; direct a stream of droplets of a DI resin material from a first inkjet print head at the surface of the substrate; alternatively or additionally direct a stream of droplets material from another inkjet print head (e.g., the support ink); move the substrate/chuck relative to the inkjet heads in an X-Y plane of the substrate, wherein the step of moving the substrate relative to the inkjet heads in the X-Y plane of the substrate, for each of a plurality of layers (and/or the patterns of conductive or DI inkjet inks within each layer), is performed in a layer-by-layer fabrication and wherein curing and sintering are performed separately. The order of CI or DI printing, and the sintering/curing that follow can be defined in the metadata of the substantially 2D layer files generated and stored in the library.

In addition, the computer program, comprises in certain implementations program code means for carrying out the steps of the methods described herein, as well as a computer program product comprising program code means stored on a medium that can be read by a computer. Memory device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc.

The non-transitory memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network).

The library of 2D layer files generated by the computerized system disclosed can be based in certain examples on converted CAD/CAM data packages such as, for example, IGES, DXF, DWG, DMIS, NC files, GERBER® files, EXCELLON®, STL, EPRT files, an ODB, an ODB++, an.asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication to the 2D layer files' metadata and can precisely define the passive RC FPF. Accordingly and in an exemplary implementation, using pre-processing algorithm, GERBER®, EXCELLON®, DWG, DXF, STL, EPRT ASM, and the like as described herein, are converted to 2D layer files. Moreover, the contacts fabricated using the methods described herein can be coupled to traces at any layer, or combination of layers.

A more complete understanding of the components, processes, assemblies, and devices disclosed herein can be obtained by reference to the accompanying examples and drawings. These figures (also referred to herein as "FIG.s") are merely schematic representations (e.g., illustrations) based on convenience and the ease of demonstrating the present disclosure, and are, therefore, not intended to indicate relative size and dimensions of the devices or components thereof and/or to define or limit the scope of the exemplary implementations. Although specific terms are used in the following description for the sake of clarity, these terms are intended to refer only to the particular structure of the exemplary implementations selected for illustration in the drawings, and are not intended to define or limit the scope of the disclosure. In the drawings and the following description below, it is to be understood that like numeric designations refer to components of like function and/or composition and/or structure.

Example I. Low Pass Filters for RF Applications

Methods
Filter Design and Schematics

The filter implementation is made by at least one transmission load trace, with capacitors connected to at least one ground plane layer. The LPF fabricated can be considered as the transmission function of two serial components, where \Tout is voltage to the capacitor. Then by transform to impedance we get the transmission function shown in Equ. 1:

$$\frac{V_{out}}{V_{in}} = \frac{1}{2\pi f \times RC + 1} \quad \text{(Equ. 1)}$$

with the cutoff frequency given by Equ. 2:

$$F_c = \frac{1}{2\pi RC} \quad \text{(Equ. 2)}$$

The specific filters presented are 4th order, for a theoretical frequency rolloff rate of about −80 dB/decade (≈−16 dB/octave) after cutoff frequency.

Figure 3A:
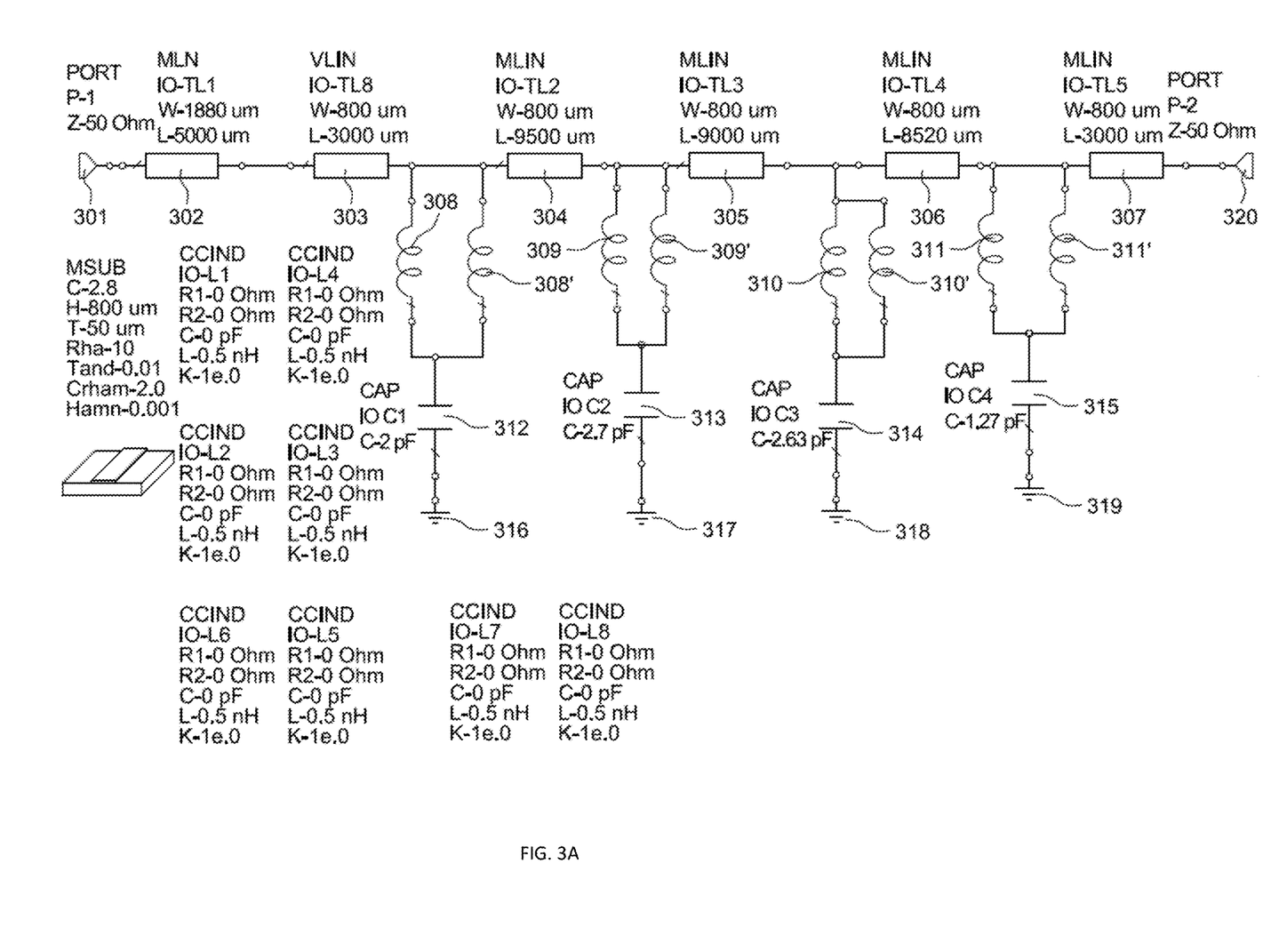
FIG. 3A, illustrates a schematic view of a fourth order Butterworth passive RC LPF operable to provide 2.4 GHz cutoff, with 5.0 GHz cutoff example illustrated in FIG. 3B.

FIG. 3A illustrates a schematic of LPF 300 configured to have cutoff frequency ($F_c$) of 2.4 GHz. A physical based equivalent circuit diagram 3A of a low pass filter 300 in accordance with a present configuration is illustrated. An input port P1 301 is connected to first transmission load trace 302 and a second transmission load trace 303. First integrally printed capacitor $C_{p1}$ 312 is connected ground plane layer through ground contact 316 between second transmission load trace 303 and third transmission load trace 304 via magnetic-coupling inductors 308, 308'. Similarly, integrally printed capacitor $C_{p2}$ 313 is connected ground plane layer through ground contact 317 between third transmission load trace 304 and fourth transmission load trace 305 via magnetic-coupling inductors 309, 309', integrally printed capacitor $C_{p3}$ 314 is connected ground plane layer through ground contact 318 between fourth transmission load trace 305 and fifth transmission load trace 306 via magnetic-coupling inductors 310, 310', and integrally printed capacitor $C_{p4}$ 315 is connected ground plane layer through ground contact 319 between fifth transmission load trace 306 and sixth transmission load trace 307 via magnetic-coupling inductors 311, 311. Sixth transmission load trace 307 is coupled to output port 320.

Furthermore, the capacitors ($C_{p1}$, $C_{p1}$, $C_{p4}$, $C_{p4}$, 312-315 respectively) are connected with one end of each forming a common terminal or node through the ground plane layer (not shown, see e.g., 104, FIG. 2A, 2B).

Figure 2C:
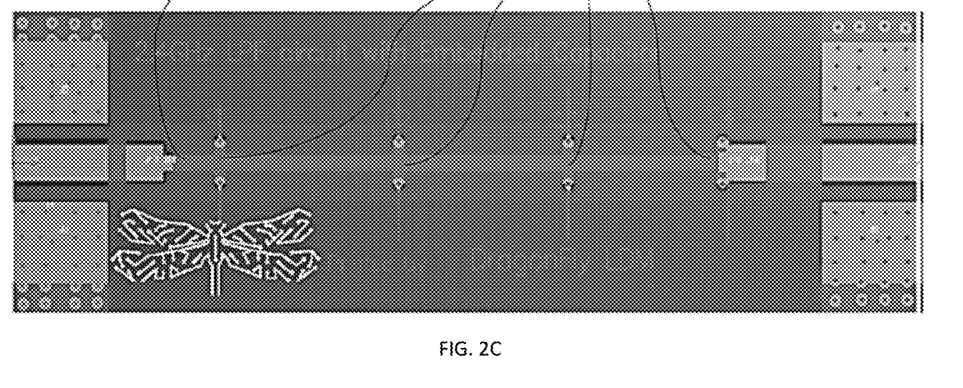

Geometry and Estimated Capacitance and Value
    $C_{p1}$ 312 (1.37 mm×1.3 mm): 2 pF
    $C_{p2}$ 313 (1.66 mm×1.37 mm): 2.5 pF
    $C_{p3}$ 314 (1.66 mm×1.37 mm): 2.5 pF
    $C_{p4}$ 315 (0.8 mm×1.37 mm): 1.2 pF
Specification Per Capacitor:
    Number of Layers: 2 Layers of 17 um thickness (up to 55 in other cases).
    DI thickness between CI layers: 55 um thickness (minimum of 35 um)
Transmission Geometry (W-Width, L-Length):
    Line 302: w=1880 um L=5000 um
    Line 303: w=800 um L=3000 um
    Line 304: w=800 um L=9500 um
    Line 305: w=800 um L=9000 um
    Line 306: w=800 um L=8500 um
    Line 307: w=1880 um L=3000 um Turning now to FIG. 2C showing a top view of circuit 300 printed using the methods and programs disclosed, implemented in the systems disclosed. FIG. 2C illustrates the RC FPF fabricated using the methods of AM implemented in the systems described with the methods and programs disclosed, with at least one transmission load trace(s) and capacitors coupled to at least one ground plane layer including the parasitic inductance of traces. The capacitors are integrally printed. The geometry of capacitors and traces can be changed and the cut-off frequency of the filter can likewise be changed accordingly to low-pass\band-pass \band-stop \high-pass.

Low-Pass with Two Cutoffs were Tested, 2.4 Ghz and 5 Ghz

Similar LPF set up of a schematic of LPF 350 configured to have cutoff frequency ($F_c$) of 5.0 GHz.

Geometry and Estimated Capacitance and Value (Passive RC FPF 350)
    $C_{p1}$ 362 (1.37 mm×1.3 mm): 0.85 pF
    $C_{p1}$ 363 (1.66 mm×1.37 mm): 1.2 pF
    $C_{p3}$ 364 (1.66 mm×1.37 mm): 1.25 pF
    $C_{p4}$ 365 (0.8 mm×1.37 mm): 0.75 pF
Lines Geometry (W-Width, L-Length) (Passive RC FPF 350):
    Line 352: w=1880 um L=8000 um
    Line 353: w=800 um L=4000 um
    Line 354: w=800 um L=5300 um
    Line 355: w=800 um L=5000 um
    Line 356: w=800 um L=5000 um
    Line 357: w=1880 um L=1880 um The shield structure illustrated in FIGS. 2A, 2B, is covering as much as possible of the internal AM components, with only the opening needed for connection (e.g., SMA male connector) not shielded.

Tested Performance Parameters:
    Passband: the frequency range that a signal can pass through the device with closest to zero dB insertion loss ($S_{21}$) and negative return loss ($S_{11}$).
    Stopband: the frequency range a signal cannot pass through the device, $S_{11}$ and $S_{12}$ supposed to characterize the opposite of passband. Theoretically, the bandwidth of this LPF (interchangeable with FPF), is equivalent to stopband and from cutoff frequency ($F_c$) on, nothing can be transmitted. In practice, because of Equivalent Series Inductance (ESI) effect (referring to inductance value representing the distributed inductances associated with a real capacitor (as opposed to an ideal capacitor), which also have inductance and resistance. Typical lowpass filter such as the ones tested, have bandwidth which is the frequency range that the parasitic induction of the system is low, and the signal does not pass. Better performance of any LPF will be considered as those filters having a wide bandwidth, with performance close to ideal filter. After $F_c$ power of passing signal are falling in slope (in other words, frequency rolloff rate) –X dB/decade (in other words, dB/10·$F_c$), or —Y dB/octave (in other words, dB/2·$T_c$)

Shielding effectiveness (SE): The ratio of the signal received (from a transmitter) without the shield, to the signal received inside the shield; the insertion loss ($S_{21}$) when the shield is placed between the transmitting antenna and the receiving antenna.

Figure 7B:
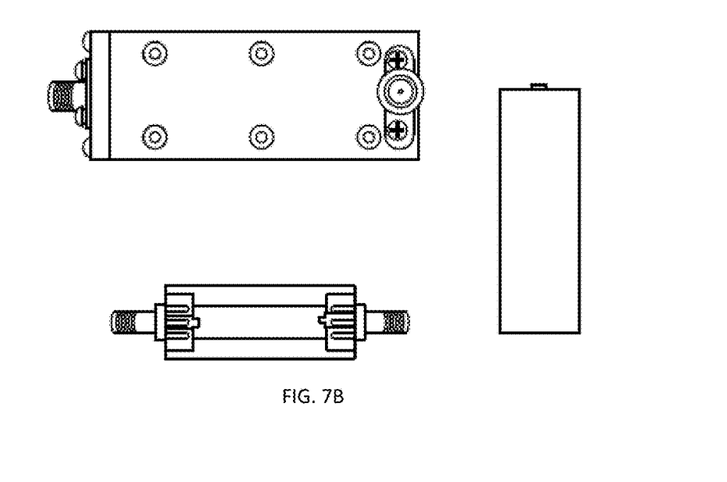

Shielding enclosure: A structure that protects its interior from the effect of an exterior electric or magnetic field, or, conversely, protects the surrounding environment from the effect of an interior electric or magnetic field. A high-performance shielding enclosure is generally capable of reducing the effects of both electric and magnetic field strengths by one to seven orders of magnitude depending upon frequency. An enclosure is normally constructed of metal with provisions for continuous electrical contact between adjoining panels (see e.g., FIG. 7A, 7B), including doors, vents, and other required openings.

Devices Tested

Figure 3B:
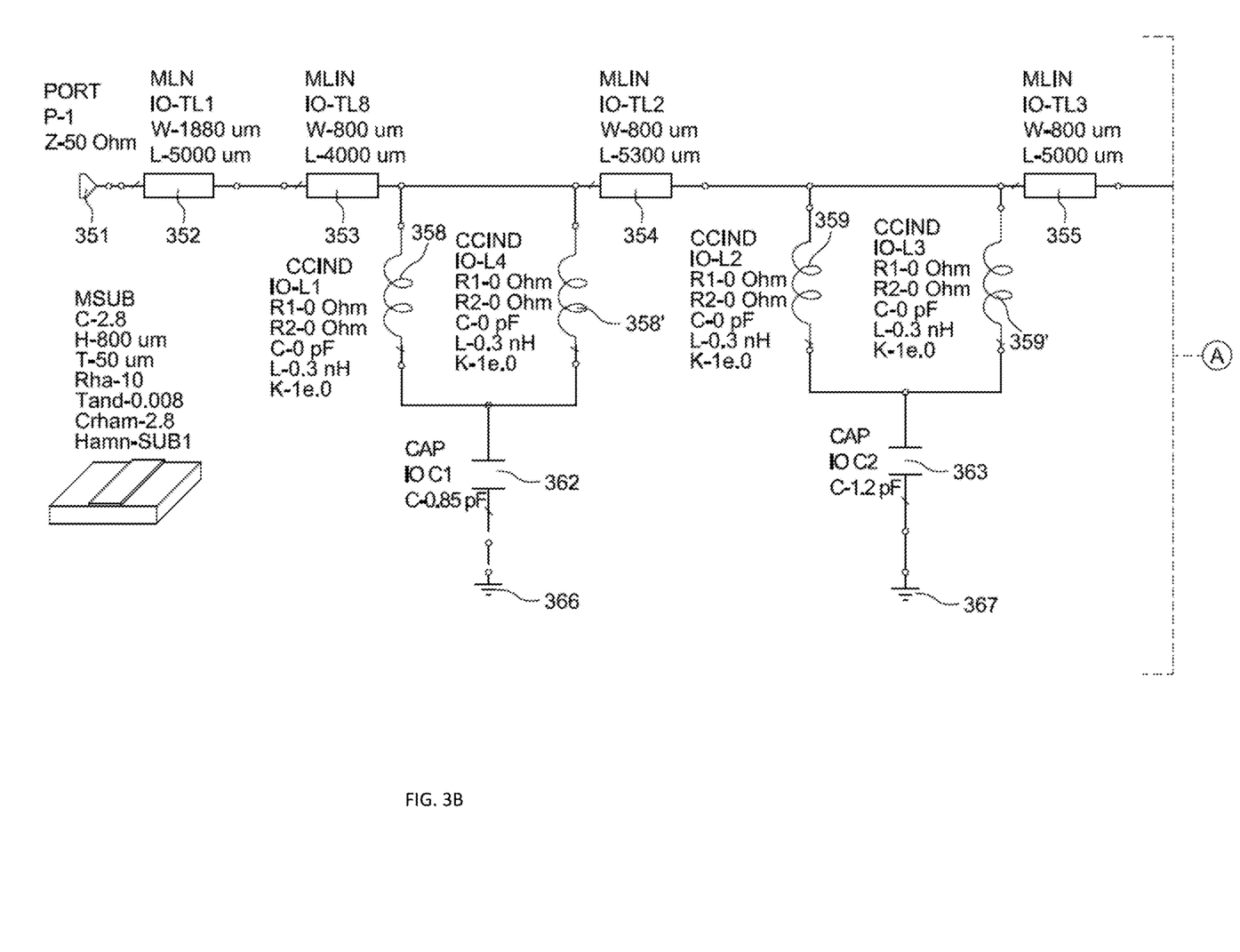

The filters were printed using the system implementing the schematics 300, 350 and specifications with both cutoff frequency of 2.4 GHz and 5.0 GHz. Both LPFs were printed in two versions, one regular and one internally shielded.

As reference, 4 types of filters were tested.

A) ATC 0402 LPF series LGA thin film. With cutoff frequency of 2484 MHz to 6000 MHz, 50 Ohm impedance, insertion loss of 0.35 dB typ. And operation temp of –40° C. to +85° C.

B) CRYSTEK Microwave, Low pass filter 50 Ohm SMA 7th order. Up to 4 Watts. (notice—can't be part of a circuit—only on cable).

C) RF microwave flp-2g3 SMA jack connectorized 2.3 GHz low-pass filter Frequency: 2.3 GHz. Bandwidth: dc –1.9 GHz –0.5 dB. 1.9-2.3 GHz @ –1 dB. 3 GHz @ –29 dB. 4 GHz –50 dB. Max. Power: 20 W. Dimensions: 16×25×50 mm.

D) PCB with off-the-shelf SMT capacitors with same schematics as AME LPF.

All 8 filters (5 printed and 3 purchased) were tested under the same conditions. Tests were conducted in a controlled temperature, anti-static lab, without noise filtration in the lab, using KEYSIGHT E5071C ENA vector network analyzer, sweeping from 300 MHz to 20 GHz, with 4 port, calibrated by ECAL, for calculating return loss (S ii) and insertion loss ($S_{21}$).

Results

I. AME Fabricated Non-Shielded LPF with 2.4 GHz Cutoff Frequency Results

At simulation the expected cutoff frequency is 2.4 GHz, and –25 dB per 1 GHz slope. After cutoff, $S_{11}$ stays about 0 dB and $S_{21}$ keep falling. As can be seen on FIG. 4A, cut-off frequency is about 2.4 GHz as set at simulation, with a slope of –27.5 dB at 1 GHz change in frequency. Passband insertion loss ($S_{21}$) is –2.0 dB, unlike the simulation which have no losses at this section. Bandwidth of stopband is –25 dB up to 20 GHz as $S_{21}$ stays below –25 dB.

II. AME Fabricated Shielded LPF with 2.4 GHz Cutoff

As can be seen on FIG. 4B, cut-off frequency remains about 2.4 GHz as set at simulation, with strong slope of –23.5 dB at 1 GHz change in frequency. Passband insertion loss is –2 dB, unlike the simulation which have no losses at this section. Bandwidth of stopband is (at least) up to 11 GHz as $S_{21}$ stays below –10 dB.

III. AME Fabricated Non-Shielded LPF with 5.0 GHz Cutoff

Figure 5A:
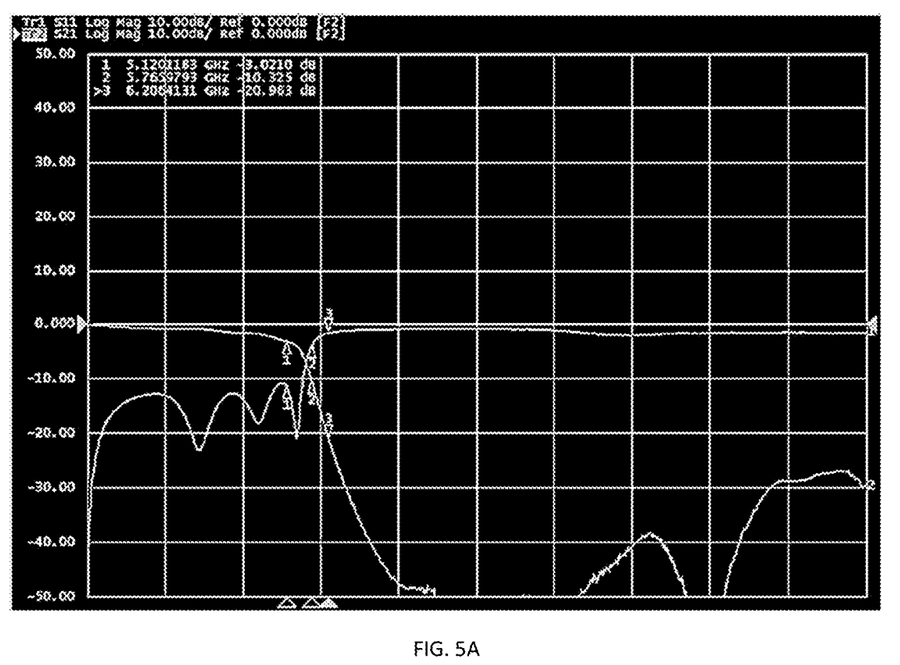
FIG. 5A, illustrates a frequency sweep of the unshielded passive RC LPF of FIG. 3B and shielded frequency sweep in FIG. 5B

As can be seen on FIG. 5A, cut-off frequency is about 5.1 GHz as set at simulation, with slope of –20 dB at 1 GHz change in frequency. Passband insertion loss is –2 dB, unlike the simulation which have no losses at this section. Bandwidth of stopband as $S_{21}$ stays below –27 dB (at least) up to 20 GHz.

IV. AME Fabricated Shielded LPF with 5.0 GHz Cutoff

Figure 5B:
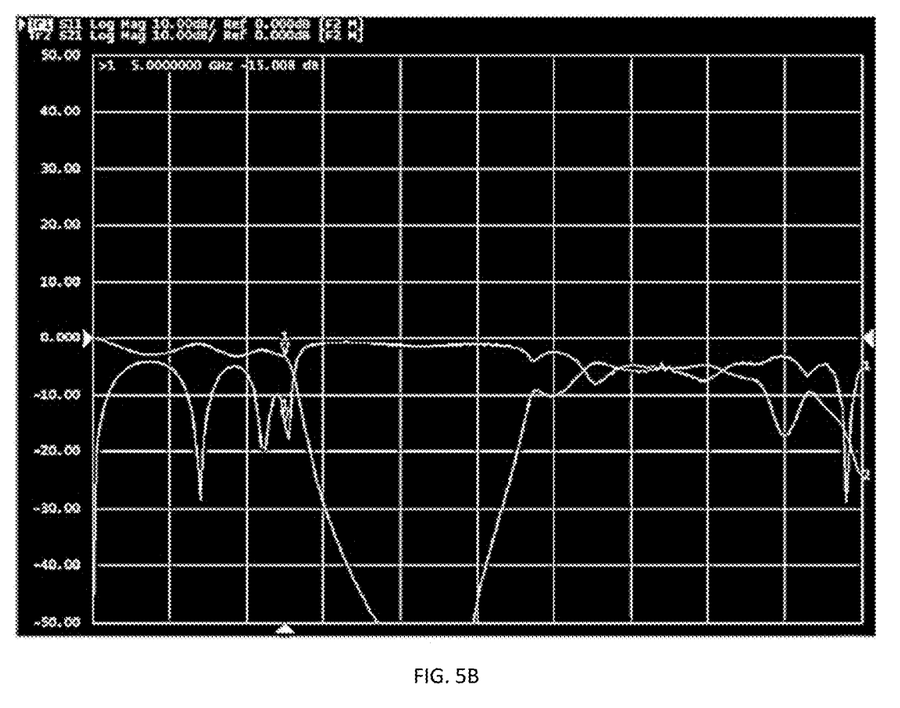

As can be seen on FIG. 5B, cut-off frequency is about 5.1 GHz as set at simulation, with slope of –30 dB at 1 GHz change in frequency. Passband insertion loss is –2.7 dB, unlike the simulation which have no losses at this section. Bandwidth of stopband as $S_{21}$ stays below –10 dB (at least) up to 11 GHz.

Figure 6:
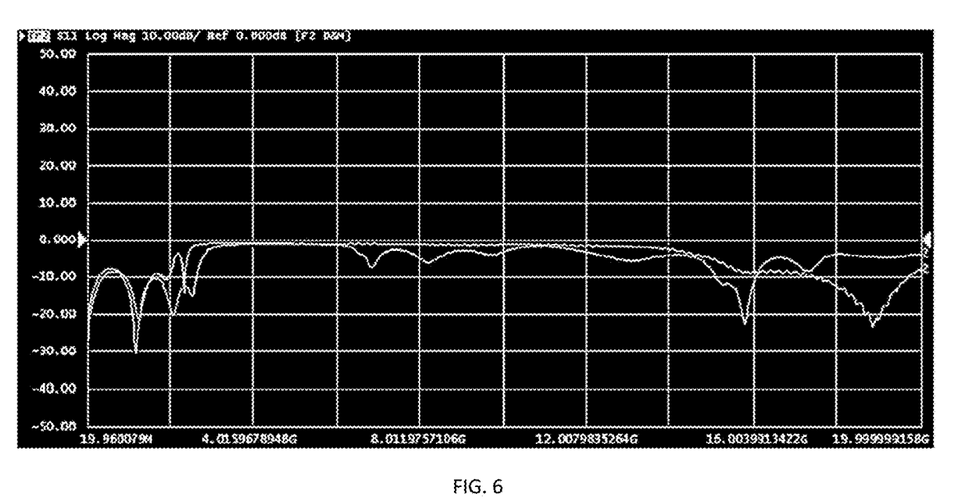
FIG. 6, shows the result of return loss (S11) signal for a capacitor fabricated and used in the LPF illustrated in FIG. 3A.

Turning now to FIG. 6, illustrating the impedance measured in AM capacitor 102j as more stable, than off-the-shelf capacitor set-up. As illustrated, the return loss has less niches and almost all the signal goes back Past the $F_c$.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the print head(s) includes one or more print head). Reference throughout the specification to "one exemplary implementation", "another exemplary implementation", "an exemplary implementation", and so forth, when present, means that a particular element (e.g., feature, structure, and/or characteristic) described in connection with the exemplary implementation is included in at least one exemplary implementation described herein, and may or may not be present in other exemplary implementations. In addition, it is to be understood that the described elements may be combined in any suitable manner in the various exemplary implementations. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly and in an exemplary implementation, provided herein is a method of fabricating a passive resistor/capacitor (RC) frequency pass filter (FPF) comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module, in communication with each of the first, and second print heads, the CAM further comprising a central processing module (CPM) including at least one processor in communication with a non-transitory computer readable storage medium configured to store instructions that, when executed by the at least one processor cause the CAM to control the ink-jet printing system, by carrying out steps that comprise: receiving a 3D visualization file representing the frequency pass filter (FPF); and generating a file library having a plurality of files, each file representing a substantially 2D layer for printing the FPF and a metafile representing at least the printing order; providing the dielectric ink composition, and the conductive ink composition; using the CAM module, obtaining from the library a first file representative of the first layer for printing the FPF; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the library a subsequent file representative of a subsequent layer for printing the FPF; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon sintering of the conductive ink pattern in the final layer, the passive RC FPF comprises: a plurality of resistors disposed in an intermediate layer configured in series with at least one transmission load trace; a plurality of capacitors disposed in an intermediate layer configured in parallel with the at least one transmission load trace, the plurality of capacitors are sized and operable to provide a predetermined cut-off frequency; and the at least one transmission load trace, sized and configured to operably couple to each of the plurality of capacitors, and each of the plurality of resistors; and removing the substrate, wherein (i) the FPF is a first low-pass filter (LPF1) and wherein the at least one transmission load trace and the capacitors are operable to deliver a frequency cut off at 2.4 GHz, (ii) with frequency rolloff of LPF1 being not less than about −20 dB/GHz with an unshielded or shielded transmission load trace, (iii) the stop band of LPF1 being lower than −25 dB between 3.4 GHz and 20 GHz, wherein (iv) wherein the FPF is a second low-pass filter (LPF2) and wherein the at least one transmission load trace and the capacitors are operable to deliver a frequency cut off at 5.0 GHz, (v) the rate of frequency rolloff in at least one of: LPF1, and LPF2 is not less than −25 dB/GHz, (vi) the $S_{12}$ isolation parameter of the at least one of LPF1, and LPF2 being not more than −25 dB between 3.4 GHz and 20 GHz, wherein (vii) the passive RC frequency pass filter (FPF) comprises at least 4 passive capacitors, wherein (viii) upon printing the final layer, the at least one transmission load trace included in the passive RC FPF are shielded, wherein (ix) upon printing the final layer, each of the plurality of capacitors is coupled to at least one ground plane layer through at least one of: a blind via, and a buried via, (x) the at least one ground plane layer is a mesh (in other words, DGS) covering between about 40% and about 99% of an intermediate layer area, wherein (xi) each capacitor is comprised of two conductive layer, each adapted to have a thickness of between about 15 μm and about 60 μm, (xii) separated by dielectric ink layer having thickness of between about 25 μm and about 60 μm, (xiii) the at least one transmission load trace coupling adjacent capacitors has a width (W) of between about 600 μm and about 2000 μm, and a length (L) of between about 2000 μm and about 10,000 μm, at least one transmission load trace(s)ize and configured to have an aspect ratio L/W>1, wherein (xiv) upon printing the final layer, the passive RC FPF comprises a plurality of transmission traces, with (xv) a plurality of meshed ground layers, each meshed ground layer aligned with a at least one transmission load trace(s)ized and adapted to form a resonant layer with the corresponding transmission trace, wherein (xvi) the file library having a plurality of files, each file representing a substantially 2D layer for printing the RC FPF is comprised of at least one of: at least one file comprising only a conductive ink (CI) pattern for printing, at least one file comprising only a dielectric ink (DI) pattern for printing, and at least one file comprising both a conductive ink pattern for printing and a dielectric ink pattern for printing (CI+DI in the same raster file), and wherein (xvii) each metadata associated with each file representing at least the printing order, further comprises data representing the location of the printed layer relative to adjacent printed layers.

Further provided herein, is a shielded Phase-locked loop (PLL) comprising the passive RC FPF formed using the methods described, and (xviii) having a length of less than 5.5 cm, a width of less than 1.0 cm and thickness of less than 0.8 cm, and (xix) forming at least one of DDS system.

Although the foregoing disclosure for using additive manufacturing to fabricate RC frequency pass filters (FPF) having predetermined cutoff frequency with wide stop band frequency, using inkjet printing based on converted 3D visualization CAD/CAM data packages has been described in terms of some exemplary implementations, other exemplary implementations will be apparent to those of ordinary skill in the art from the disclosure herein. Moreover, the described exemplary implementations have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed:

1. A method of fabricating a passive resistor/capacitor (RC) frequency pass filter (FPF) comprising:
   a. providing an ink jet printing system comprising:
      i. a first print head, sized and configured to dispense a dielectric ink composition;
      ii. a second print head sized and configured to dispense a conductive ink composition;

iii. a conveyor, operably coupled to the first, and the second print heads configured to convey a substrate included with the system, to each of the first, and the second print heads; and iv. a computer aided manufacturing ("CAM") module, in communication with each of the first, and second print heads, the CAM further comprising a central processing module (CPM) including at least one processor in communication with a non-transitory computer readable storage medium configured to store instructions that, when executed by the at least one processor cause the CAM to control the ink-jet printing system, by carrying out steps that comprise: receiving a 3D visualization file representing the frequency pass filter (FPF); and generating a file library having a plurality of files, each file representing a substantially 2D layer for printing the FPF and a metafile representing at least the printing order;

b. providing the dielectric ink composition, and the conductive ink composition;

c. using the CAM module, obtaining from the library a first file representative of the first layer for printing the FPF; the first file comprising printing instructions for a pattern representative of at least one of: the dielectric ink, and the conductive ink;

d. using the first print head, forming the pattern corresponding to the dielectric ink;

e. curing the pattern corresponding to the dielectric ink representation in the 2D layer of the FPE;

f. using the second print head, forming the pattern corresponding to the conductive ink;

g. sintering the pattern corresponding to the conductive ink;

h. using the CAM module, obtaining from the library a subsequent file representative of a subsequent layer for printing the FPF; the subsequent file comprising printing instructions for a pattern representative of at least one of: the dielectric ink, and the conductive ink;

i. repeating the steps of: using the first print head, forming the pattern corresponding to the dielectric ink, to the step of using the CAM module, obtaining from the 2D file library the subsequent, substantially 2D layer, wherein upon sintering of the conductive ink pattern in a final layer, the passive RC FPF comprises:

i. a plurality of resistors disposed in an intermediate layer configured in series with at least one transmission load trace;

ii. a plurality of capacitors disposed in an intermediate layer configured in parallel with the at least one transmission load trace, the plurality of capacitors are sized and operable to provide a predetermined cut-off frequency; and iii. the at least one transmission load trace sized and configured to operably couple to each of the plurality of capacitors, and each of the plurality of resistors; and j. removing the substrate from the FPF.

2. The method of claim 1, wherein the FPF is a first low-pass filter (LPF1) and wherein the at least one transmission load trace and the capacitors are operable to deliver a frequency cut off at 2.4 GHz.

3. The method of claim 2, wherein the rate of frequency rolloff of LPF1 is not less than about -20 dB/GHz with an unshielded or shielded transmission load trace.

4. The method of claim 3, wherein the stop band of LPF1 is lower than-25 dB between 3.4 GHz and 20 GHz.

5. The method of claim 2, wherein the rate of frequency rolloff in LPF1, is not less than −25 dB/GHz.

6. The method of claim 5, wherein the $S_{12}$ isolation parameter of the LPF1 is not more than −25 dB between 3.4 GHz and 20 GHz.

7. The method of claim 2, wherein upon printing the final layer, each of the plurality of capacitors is coupled to at least one ground plane layer via at least one of: a blind via, and a buried via.

8. The method of claim 7, wherein upon printing the final layer, the at least one ground plane layer is a mesh covering between about 40% and about 99% of an intermediate layer area.

9. The method of claim 7, wherein upon printing the final layer, each capacitor is comprised of two conductive layer, each adapted to have a thickness of between about 15 um and about 60 um.

10. The method of claim 9, wherein the two conductive layers are separated by dielectric ink layer having thickness of between about 25 um and about 60 um.

11. The method of claim 10, wherein the at least one transmission load trace coupling adjacent capacitors has a width (W) of between about 600 um and about 2000 um, and a length (L) of between about 2000 um and about 10,000 um, transmission line size and configured to have an aspect ratio L/W>1.

12. The method of claim 11, wherein upon printing the final layer, the passive RC FPF comprises a plurality of transmission traces.

13. The method of claim 12, wherein upon printing the final layer, the passive RC FPF comprises a plurality of meshed ground layers, each meshed ground layer aligned with a transmission line sized and adapted to form a resonant layer with the corresponding transmission line.

14. The method of claim 1, wherein the FPF is a second low-pass filter (LPF2) and wherein the at least one transmission load trace and the capacitors are operable to deliver a frequency cut off at 5.0 GHz.

15. The method of claim 14, wherein the rate of frequency rolloff in LPF2 is not less than −25 dB/GHz.

16. The method of claim 15, wherein the $S_{12}$ isolation parameter of LPF2 is not more than −25 dB between 3.4 GHz and 20 GHz.

17. The method of claim 1, wherein the passive RC frequency pass filter (FPF) comprises at least 4 passive capacitors.

18. The method of claim 1, wherein upon printing the final layer, the at least one transmission load traces included in the passive RC FPF are each shielded.

19. The method of claim 1, wherein the file library having a plurality of files, each file representing a substantially 2D layer for printing the FPF is comprised of at least one of: at least one file comprising only a conductive ink pattern for printing, at least one file comprising only a dielectric ink pattern for printing, and at least one file comprising both a conductive ink pattern for printing and a dielectric ink pattern for printing.

20. The method of claim 19, wherein each metadata associated with each file representing at least the printing order, further comprises data representing the location of the printed layer relative to adjacent printed layers.

* * * * *